(12) United States Patent
Jeon et al.

(10) Patent No.: US 10,878,869 B2
(45) Date of Patent: Dec. 29, 2020

(54) MEMORY DEVICE INCLUDING COMMON MODE EXTRACTOR

(71) Applicant: Samsung Electronics Co., Ltd., Suwon-si (KR)

(72) Inventors: Ju-ho Jeon, Bucheon-si (KR); Han-gi Jung, Hwaseong-si (KR); Hun-dae Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 77 days.

(21) Appl. No.: 16/192,975

(22) Filed: Nov. 16, 2018

(65) Prior Publication Data

US 2019/0156874 A1    May 23, 2019

(30) Foreign Application Priority Data

Nov. 17, 2017   (KR) .......................... 10-2017-0153976

(51) Int. Cl.

| | |
|---|---|
| *G11C 8/18* | (2006.01) |
| *G11C 7/22* | (2006.01) |
| *G11C 5/14* | (2006.01) |
| *G06F 3/06* | (2006.01) |

(52) U.S. Cl.
CPC .............. *G11C 8/18* (2013.01); *G06F 3/0613* (2013.01); *G06F 3/0658* (2013.01); *G06F 3/0659* (2013.01); *G06F 3/0673* (2013.01); *G11C 5/147* (2013.01); *G11C 7/222* (2013.01)

(58) Field of Classification Search
CPC ........... G11C 5/147; G11C 7/222; G11C 8/18; G11C 7/1048; G06F 3/0613; G06F 3/0658; G06F 3/0659; G06F 3/0673
See application file for complete search history.

(56) References Cited

U.S. PATENT DOCUMENTS

| | | | |
|---|---|---|---|
| 6,504,404 | B2 | 1/2003 | Uchiki et al. |
| 6,696,890 | B2 | 2/2004 | Hedberg et al. |
| 7,184,323 | B2 | 2/2007 | Fujisawa |
| 7,215,143 | B1 | 5/2007 | Chung et al. |
| 7,502,251 | B2 | 3/2009 | Choi et al. |
| 7,719,322 | B2 | 5/2010 | Hayashi et al. |
| 7,999,591 | B2 | 8/2011 | Kim et al. |
| 8,325,946 | B2 | 12/2012 | Sakai et al. |
| 8,576,645 | B2 | 11/2013 | Kim |
| 9,130,793 | B2 | 9/2015 | Penney |
| 9,299,413 | B1 | 3/2016 | Chae |

(Continued)

FOREIGN PATENT DOCUMENTS

| | | |
|---|---|---|
| KR | 10-2012-0098027 | 9/2012 |
| KR | 10-2016-0076890 | 7/2016 |

*Primary Examiner* — Zhuo H Li
(74) *Attorney, Agent, or Firm* — Harness, Dickey and Pierce, P.L.C.

(57) ABSTRACT

A memory device may be configured to receive a differential data strobe signal and an external data signal from outside the memory device, the memory device may include control circuitry configured to, extract a common mode of the differential data strobe signal to generate a common mode signal, generate an internal data signal based on the external data signal and the common mode signal, and generate an internal data strobe signal based on the differential data strobe signal, the internal data strobe signal associated with latching the internal data signal.

20 Claims, 12 Drawing Sheets

(56) References Cited

U.S. PATENT DOCUMENTS

| | | | |
|---|---|---|---|
| 2009/0252268 A1* | 10/2009 | Jang | G09G 3/20 |
| | | | 375/362 |
| 2010/0166129 A1* | 7/2010 | Lee | H04L 7/0008 |
| | | | 375/354 |
| 2013/0223160 A1* | 8/2013 | Lee | G11C 7/1084 |
| | | | 365/189.02 |
| 2016/0118103 A1* | 4/2016 | Iljima | G11C 11/4096 |
| | | | 365/189.07 |
| 2016/0148663 A1* | 5/2016 | Tokuhiro | G11C 7/1093 |
| | | | 365/189.07 |
| 2017/0031747 A1* | 2/2017 | Kim | G06F 11/0784 |
| 2018/0075884 A1* | 3/2018 | Choi | G06F 3/0659 |

\* cited by examiner

MEMORY DEVICE INCLUDING COMMON MODE EXTRACTOR

CROSS-REFERENCE TO RELATED APPLICATION

This application claims the benefit of Korean Patent Application No. 10-2017-0153976, filed on Nov. 17, 2017, in the Korean Intellectual Property Office, the disclosure of which is incorporated herein in its entirety by reference.

BACKGROUND

Example embodiments of the inventive concepts relate to a memory device including a common mode extractor regarding a differential signal.

Semiconductor memory devices may be classified into volatile memory such as Dynamic Random Access Memory (DRAM) and Static RAM (SRAM) and non-volatile memory such as Electrically Erasable Programmable Read Only Memory (EEPROM), Ferroelectric RAM (FRAM), Phase-change RAM (PRAM), Magnetic RAM (MRAM), and flash memory. Volatile memory requires power not to lose stored data, while non-volatile memory retains stored data even though power is not supplied.

Semiconductor memory devices may input and output data in response to data strobe signals that may be input at regular intervals.

SUMMARY

Example embodiments of the inventive concepts provide a memory device capable of compensating for noise of a reference voltage in order to increase an accuracy of internal data signals.

According to an example embodiment of the inventive concepts, there is provided a memory device configured to receive a differential data strobe signal and an external data signal from outside the memory device, the memory device including control circuitry configured to, extract a common mode of the differential data strobe signal to generate a common mode signal, generate an internal data signal based on the external data signal and the common mode signal, and generate an internal data strobe signal based on the differential data strobe signal, the internal data strobe signal associated with latching the internal data signal.

According to another example embodiments of the inventive concepts, there is provided a memory device configured to receive a differential clock signal and an external command/address signal from outside the memory device, the memory device including control circuitry configured to, extract a common mode of the differential clock signal to generate a clock common mode signal, generate an internal command/address signal based on the external command/address signal and the clock common mode signal, and generate an internal clock signal based on the differential clock signal, the internal clock signal being associated with latching the internal command/address signal.

According to another example embodiment of the inventive concepts, there is provided a memory device configured to receive a differential data strobe signal and an external data signal from a memory controller, the memory device including control circuitry configured to, extract a common mode of the differential data strobe signal to generate a common mode signal such that a voltage level of the common mode signal is same as an average of a logic-high voltage level and a logic-low voltage level of the external data signal, and generate an internal data signal based on the external data signal and the common mode signal.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
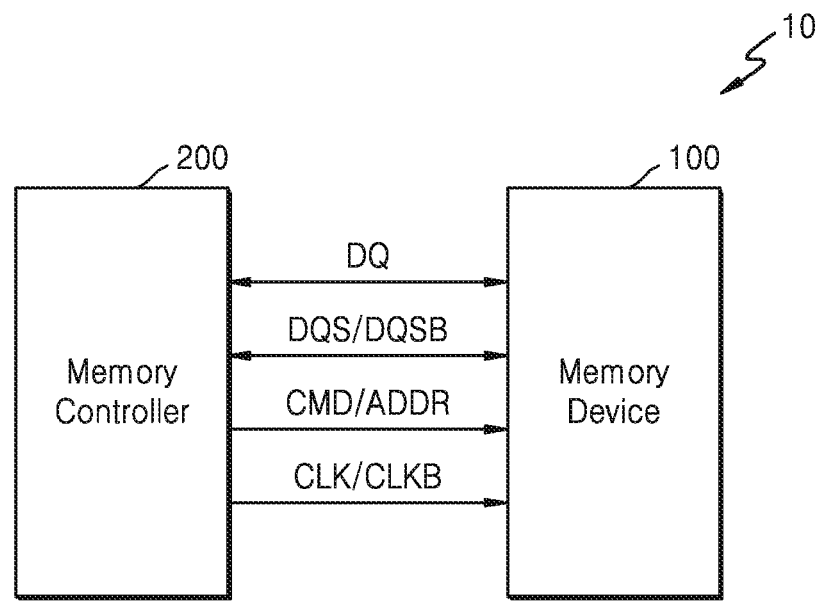
FIG. 1 is a block diagram of a memory system according to an example embodiment.

FIG. 1 is a block diagram of a memory system 10 according to an example embodiment.

As illustrated in FIG. 1, the memory system 10 includes a memory device 100 and a memory controller 200.

In an example embodiment, the memory device 100 may be Dynamic Random Access Memory (DRAM) such as Double Data Rate Synchronous Dynamic Random Access Memory (DDR SDRAM), Low Power Double Data Rate (LPDDR) SDRAM, Graphics Double Data Rate (GDDR) SDRAM, Low Power DDR (LPDDR), or Rambus Dynamic Random Access Memory (RDRAM). However, example embodiments are not limited thereto.

Alternatively, in another example embodiment, the memory device 100 may be a non-volatile memory device such as Electrically Erasable Programmable Read-Only Memory (EEPROM), flash memory, Phase Change Random Access Memory (PRAM), Resistance Random Access Memory (RRAM), Nano Floating Gate Memory (NFGM), Polymer Random Access Memory (PoRAM), Magnetic Random Access Memory (MRAM), or Ferroelectric Random Access Memory (FRAM). For example, the memory device 100 may be negative-AND (NAND) flash memory or NOR flash memory. However, example embodiments are not limited thereto.

The memory controller 200 may control the memory device 100. The memory controller 200 may transmit, to the memory device 100, an external data signal DQ, a differential clock signal CLK/CLKB, an external command CMD, an external address ADDR, a differential data strobe signal DQS/DQSB and control signals for controlling the memory device 100, and may receive the differential data strobe signal DQS/DQSB and the external data signal DQ from the memory device 100. However, depending on types of the memory device 100, the memory controller 200 may not transmit the differential clock signal CLK/CLKB as well as the differential data strobe signal DQS/DQSB, but may transmit only the differential clock signal CLK/CLKB. In this case, the differential clock signal CLK/CLKB may be used, instead of the differential data strobe signal DQS/DQSB, in the semiconductor devices according to one or more example embodiments of the inventive concepts.

The memory controller 200 may transmit a read command and a write command to the memory device 100.

Figure 2:
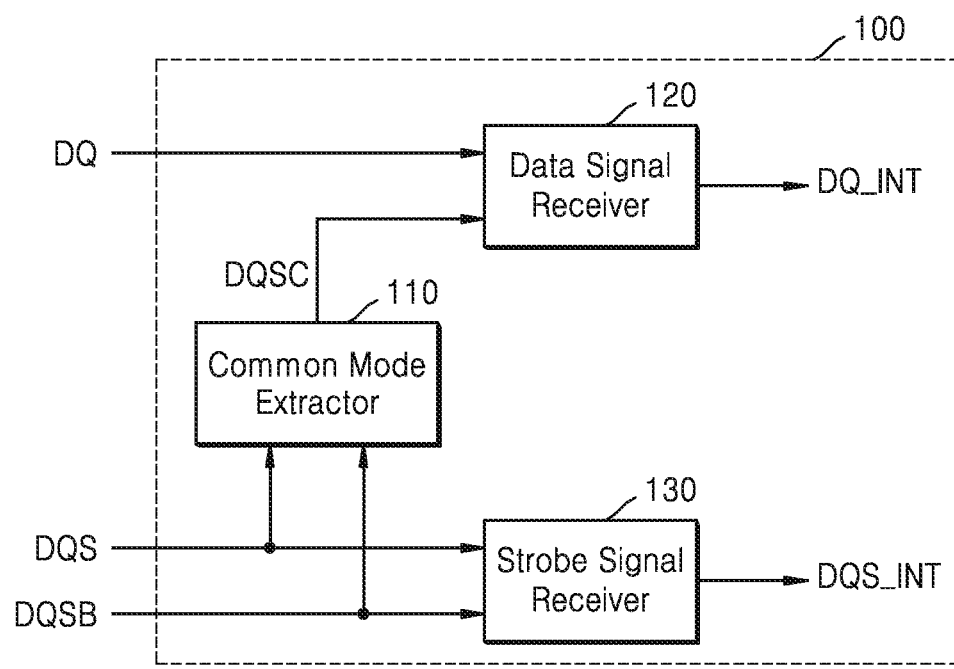
FIG. 2 is a block diagram of an example of a memory device of FIG. 1.
Figure 3:
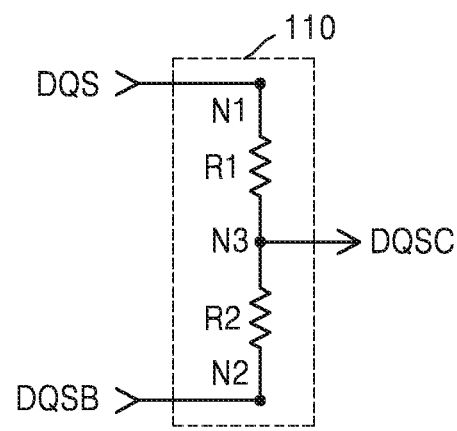
FIG. 3 is a circuit diagram of an example of a common mode extractor of FIG. 2.

FIG. 2 is a block diagram of an example of a memory device 100 of FIG. 1. FIG. 3 is a circuit diagram of an example of a common mode extractor 110 of FIG. 2.

Referring to FIG. 2, the memory device 100 may include the common mode extractor 110, a data signal receiver 120, and a strobe signal receiver 130.

In some example embodiments, the memory device 100 may include a control circuitry (not shown) for controlling operations of the memory device 100. The control circuitry may include the common mode extractor 110, a data signal receiver 120, and a strobe signal receiver 130. The common mode extractor 110, the data signal receiver 120 and the strobe signal receiver 130 may be implemented by respective circuit.

The common mode extractor 110 may receive the differential data strobe signal DQS/DQSB and may output a common mode signal DQSC by extracting a common mode of the differential data strobe signal DQS/DQSB, based on the differential data strobe signal DQS/DQSB. Therefore, the common mode signal DQSC, which has a value between a high voltage level and a low voltage level of a single data strobe signal DQS, may be output.

Referring to FIGS. 2 and 3, the common mode extractor 110 may include a first resistor R1 connected between a first node N1 and a third node N3 and a second resistor R2 connected between a second node N2 and the third node N3. Sizes of the first resistor R1 and the second resistor R2 may be substantially the same as each other, and a voltage level of the common mode signal DQSC, which is output to the third node N3, may have a value in which a voltage of the first node N1 and a voltage of the second node N2 are distributed by the first resistor R1 and the second resistor R2.

Referring back to FIG. 2, the data signal receiver 120 may receive the external data signal DQ and the common mode signal DQSC, compare the external data signal DQ with the common mode signal DQSC, and generate an internal data signal DQ_INT. In an example embodiment, the data signal receiver 120 may include an amplifier and thus may amplify a voltage difference between the external data signal DQ and the common mode signal DQSC, thereby outputting the internal data signal DQ_INT.

The strobe signal receiver 130 may receive the differential data strobe signal DQS/DQSB and may generate an internal strobe signal DQS_INT for latching the internal data signal DQ_INT. In an example embodiment, the strobe signal receiver 130 may include an amplifier and thus may amplify a voltage difference between the differential data strobe signals DQS/DQSB, thereby outputting the amplified voltage difference as the internal strobe signal DQS_INT.

The memory device 100 may further include a data latch circuit (not shown). The data latch circuit may receive the internal data signal DQ_INT and the internal strobe signal DQS_INT and may latch the internal data signal DQ_INT based on the internal strobe signal DQS_INT, thereby generating a latch signal.

When a memory device uses an internal reference voltage generated within the memory device 100 to generate an internal data signal, the internal reference voltage may be affected by noise due to characteristics of the memory device 100. Further, since an external data signal DQ is a signal transmitted to a memory device from the outside, the internal reference voltage may be affected by noise due to reasons other than the characteristics of the memory device 100. Thus, when the data signal receiver 120 generates the internal data signal DQ_INT based on the internal reference voltage, the internal data signal DQ_INT may be generated while noise in the internal reference voltage has not yet been removed.

Also, when a data signal receiver uses the internal reference voltage, a memory controller 200 may take a certain amount of time to set and adjust a level of the internal reference voltage so as to secure accuracy of the internal data signal DQ_INT.

In contrast, in one or more example embodiments, the memory device 100 may generate the internal data signal DQ_INT based on a common mode voltage of the differential data strobe signal DQS/DQSB instead of using a reference voltage generated within the memory device 100.

Since the differential data strobe signal DQS/DQSB and the external data signal DQ may be received from the memory controller 200 by the memory device 100, the differential data strobe signal DQS/DQSB and the external data signal DQ may be commonly affected by noise generated outside the memory device 100. Since the data signal receiver 120 uses the common mode voltage of the differential data strobe signal DQS/DQSB, the memory device 100 may remove common noise generated by, for example, the memory controller 200, from within the common mode signal DQSC and the external data signal DQ. Also, a time taken by the memory controller 200 to set and adjust the level of the reference voltage may be saved.

Figure 4:
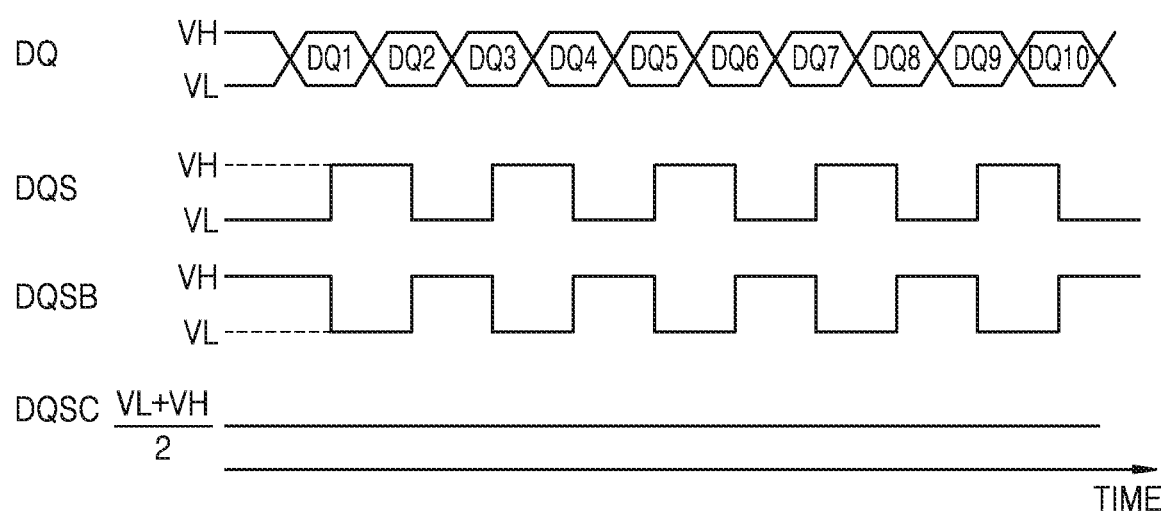
FIG. 4 is a timing diagram for explaining an operation of a memory device according to an example embodiment.

FIG. 4 is a timing diagram for explaining an operation of the memory device 100, according to an example embodiment.

Referring to FIG. 4, the differential data strobe signal DQS/DQSB may include a data strobe signal DQS and a data strobe signal complement DQSB. Since the data strobe signal DQS and the data strobe signal complement DQSB are the same as each other except that the potentials of the data strobe signal DQS and the data strobe signal complement DQSB are opposite to each other, low voltage levels VL and high voltage levels VH of the data strobe signal DQS and the data strobe signal complement DQSB are the same as each other. Therefore, the common mode signal DQSC may have an average ((VL+VH)/2) of the high voltage VH and the low voltage level VL of the data strobe signal DQS.

The external data signal DQ may have either a high voltage level VH or a low voltage level VL, depending on a data value. In this case, the high voltage level VH of the external data signal DQ may be the same as that of the data strobe signal DQS, and the low voltage level VL of the external data signal DQ may be the same as that of the data strobe signal DQS because the external data signal DQ and the data strobe signal DQS generated outside the memory device 100 are transmitted to the memory device 100. Accordingly, a voltage level of the common mode signal DQSC may be equal to an average ((VL+VH)/2) of the high voltage level VH and the low voltage level VL of the external data signal DQ.

Referring to FIGS. 2 and 4, since the voltage level of the common mode signal DQSC is equal to the average ((VL+VH)/2) of the high voltage level VH and the low voltage level VL of the external data signal DQ, although a separate reference voltage is not generated within the memory device 100, the data signal receiver 120 may use the common mode signal DQSC, which is extracted by the common mode extractor 110, so as to generate the internal data signal DQ_INT.

Figure 5:
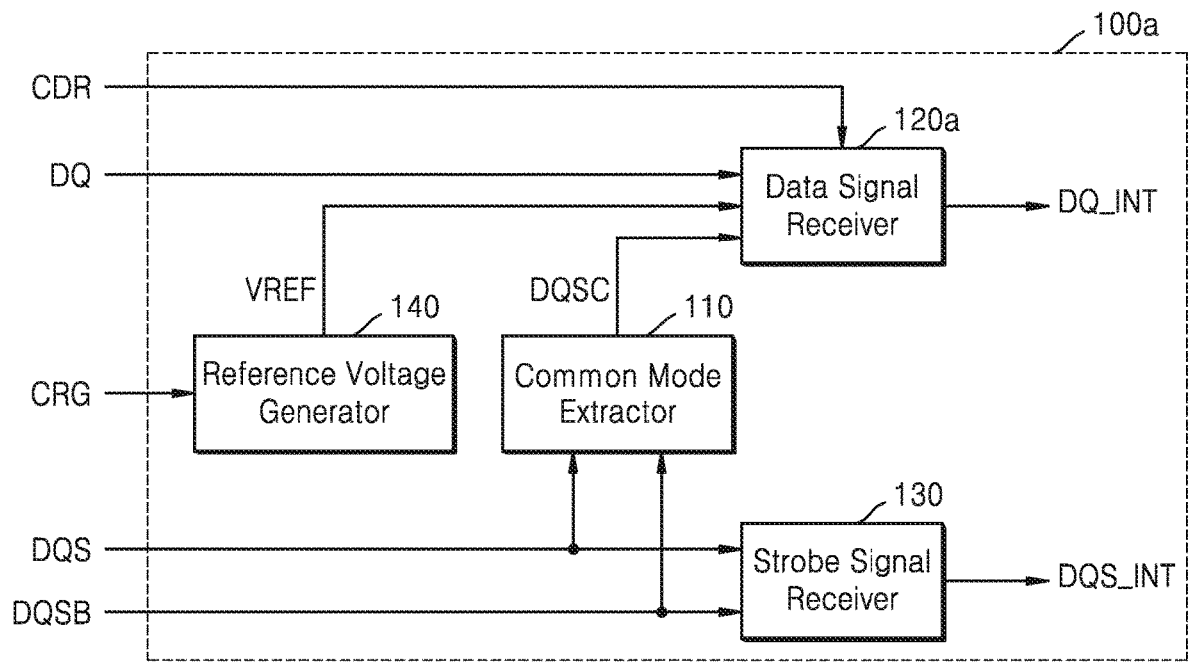
FIG. 5 is a block diagram of an example of the memory device of FIG. 1.

FIG. 5 is a block diagram of an example of the memory device 100 of FIG. 1. In FIGS. 2 and 5, like reference numerals denote like elements, and for convenience of explanation, detailed descriptions of like elements will be omitted herein.

Referring to FIG. 5, a memory device 100a may include the common mode extractor 110, a data signal receiver 120a, the strobe signal receiver 130, and a reference voltage generator 140.

In some example embodiments, the memory device 100a may include a control circuitry (not shown) for controlling operations of the memory device 100a. The control circuitry may include the common mode extractor 110, the data signal receiver 120a, the strobe signal receiver 130, and the reference voltage generator 140. The common mode extractor 110, the data signal receiver 120a, the strobe signal receiver 130, and the reference voltage generator 140 may be implemented by respective circuit.

The reference voltage generator 140 may generate a reference voltage signal VREF having a voltage level between a high voltage level and a low voltage level of the external data signal DQ. In an example embodiment, the voltage level of the reference voltage signal VREF may be equal to an average of the high voltage level and the low voltage level of the external data signal DQ.

For example, the reference voltage generator 140 may distribute a power voltage and output the distributed power voltage as the reference voltage signal VREF. The reference voltage generator 140 may adjust a distribution ratio of the power voltage based on a reference voltage control signal CRG received from the outside and thus may adjust the voltage level of the reference voltage signal VREF. The reference voltage control signal CRG may be received from the memory controller (200 of FIG. 1).

The data signal receiver 120a may receive the external data signal DQ, the common mode signal DQSC, and the reference voltage signal VREF. The data signal receiver 120a may operate in response to a receiver control signal CDR received from the outside. The receiver control signal CDR may be received from the memory controller 200. In an example embodiment, the receiver control signal CDR may include a write command (e.g., the external command CMD of FIG. 1).

The data signal receiver 120a may select one of the common mode signal DQSC and the reference voltage signal VREF in response to the receiver control signal CDR received from the outside. In an example embodiment, the data signal receiver 120a may generate the internal data signal DQ_INT based on the selected signal (the common mode signal DQSC or the reference voltage signal VREF) and the external data signal DQ. The data signal receiver 120a may include an amplifier and may amplify the voltage difference between the internal data signal DQ_INT and the selected signal (the common mode signal DQSC or the reference voltage signal VREF), thereby outputting the amplified voltage difference as the internal data signal DQ_INT. The data signal receiver 120a according to an example embodiment will be described below with reference to FIGS. 6A and 6B.

In another example embodiment, the data signal receiver 120a may generate the internal data signal DQ_INT based on the selected signal (the common mode signal DQSC or the reference voltage signal VREF), the reference voltage signal VREF, and the external data signal DQ. The data signal receiver 120a according to another embodiment will be described below with reference to FIGS. 7A and 7B.

Figure 6A:
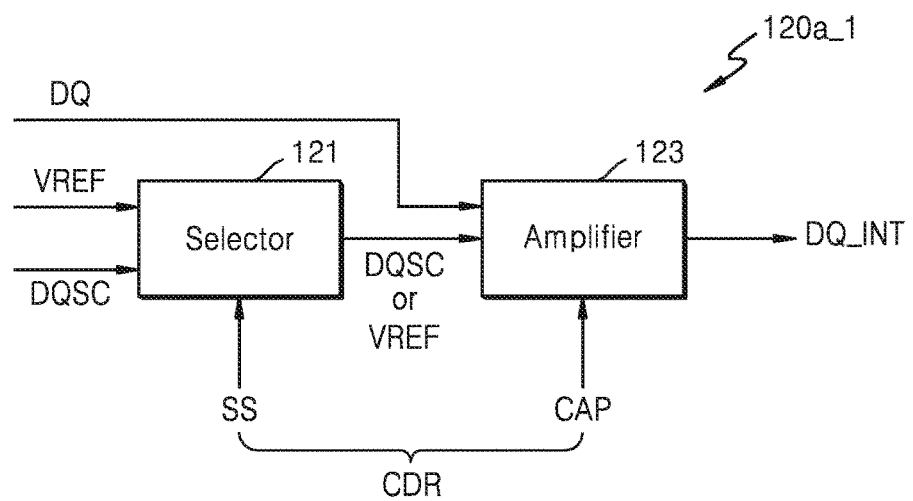
FIG. 6A is a block diagram of an example of a data signal receiver of FIG. 5.
Figure 6B:
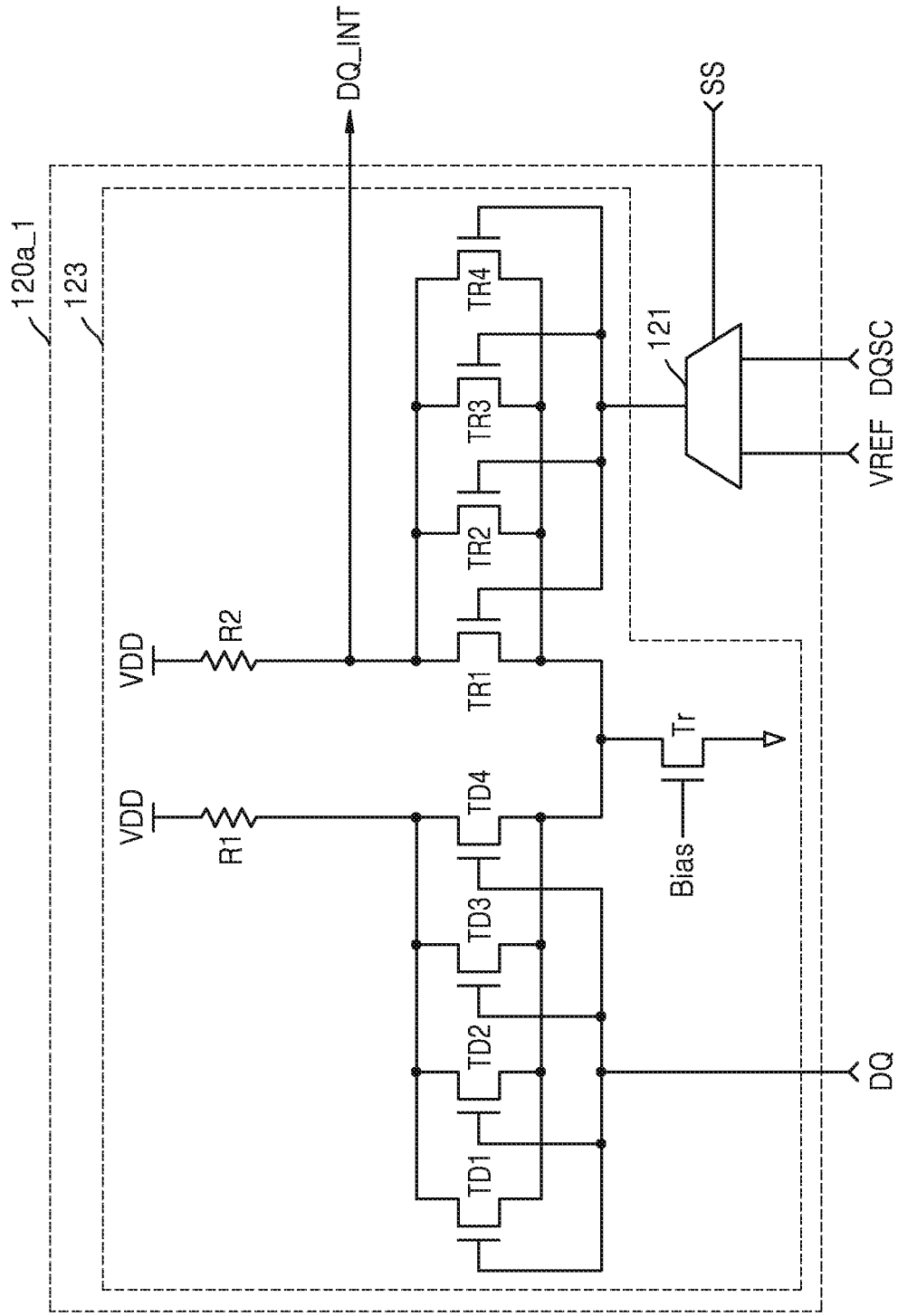
FIG. 6B is a circuit diagram of an example of a data signal receiver of FIG. 6A.

FIG. 6A is a block diagram of an example of the data signal receiver 120a of FIG. 5. FIG. 6B is a circuit diagram of an example of a data signal receiver 120_1 of FIG. 6A.

Referring to FIGS. 5 and 6A, the data signal receiver 120a_1 may include a selector 121 and an amplifier 123 that may be configured to receive a selection signal SS and an amplifier control signal CAP included in the receiver control signal CDR, respectively.

The selector 121 may select one of the common mode signal DQSC output from the common mode extractor 110 and the reference voltage signal VREF output from the reference voltage generator 140 in response to the selection signal SS.

In an example embodiment, the selector 121 may be a multiplexer. The selector 121 may select one of the common mode signal DQSC and the reference voltage signal VREF (e.g., the common mode signal DQSC) and may output the selected signal. The selection signal SS may be included in the receiver control signal CDR.

The voltage level of the reference voltage signal VREF may be adjusted based on the reference voltage control signal CRG received from the outside of the memory device 100a. The memory controller (e.g., the memory controller 200 of FIG. 1) may generate the reference voltage control signal CRG and thus may control the reference voltage generator 140 to generate a desired voltage level. In contrast, since the voltage level of the common mode signal DQSC may be determined based on the differential data strobe signal DQS/DQSB, a certain value may be maintained when the voltage level of the differential data strobe signal DQS/DQSB is not changed. The memory controller 200 may control the memory device 100a to selectively use the reference voltage signal VREF or the common mode signal DQSC by taking the external data signal DQ into account.

The amplifier 123 may receive the external data signal DQ and the selected signal (the common mode signal DQSC or the reference voltage signal VREF) and may compare the external data signal DQ with the selected signal (the common mode signal DQSC or the reference voltage signal VREF) in response to the amplifier control signal CAP. Therefore, the amplifier 123 may function as a comparator. The amplifier 123 may generate the internal data signal DQ_INT. The amplifier control signal CAP may be included in the receiver control signal CDR, and in an example embodiment, the amplifier control signal CAP may be a write command (e.g., the external command CMD of FIG. 1).

Referring to FIGS. 6A and 6B, the amplifier 123 may include first transistors TD1 to TD4, second transistors TR1 to TR4, and a transistor Tr and resistors (e.g., first and second resistors R1 and R2). FIG. 6B illustrates nine transistors and two resistors, but the number of transistors and resistors included in the amplifier 123 according to example embodiments are not limited thereto. In an example embodiment, a connection of a power voltage VDD to the first and second resistors R1 and R2 may be controlled by the amplifier control signal CAP.

The external data signal DQ may be input to gates of the first transistors TD1 to TD4, and the signal (the common mode signal DQSC or the reference voltage signal VREF) selected by the selector 121 may be input to gates of the second transistors TR1 to TR4.

The voltage difference between the external data signal DQ and the selected signal (the common mode signal DQSC or the reference voltage signal VREF) may be converted by the transistor Tr into a current difference, and the current difference may be converted by the first and second resistors R1 and R2 into a voltage difference and then amplified such that the amplified voltage difference may be output as the internal data signal DQ_INT.

Figure 7A:
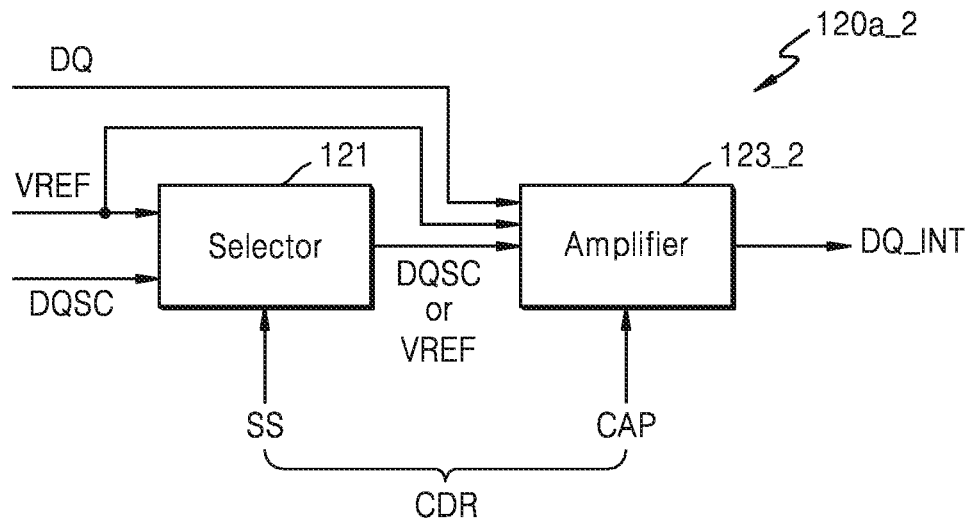
FIG. 7A is a block diagram of an example of the data signal receiver of FIG. 5.
Figure 7B:
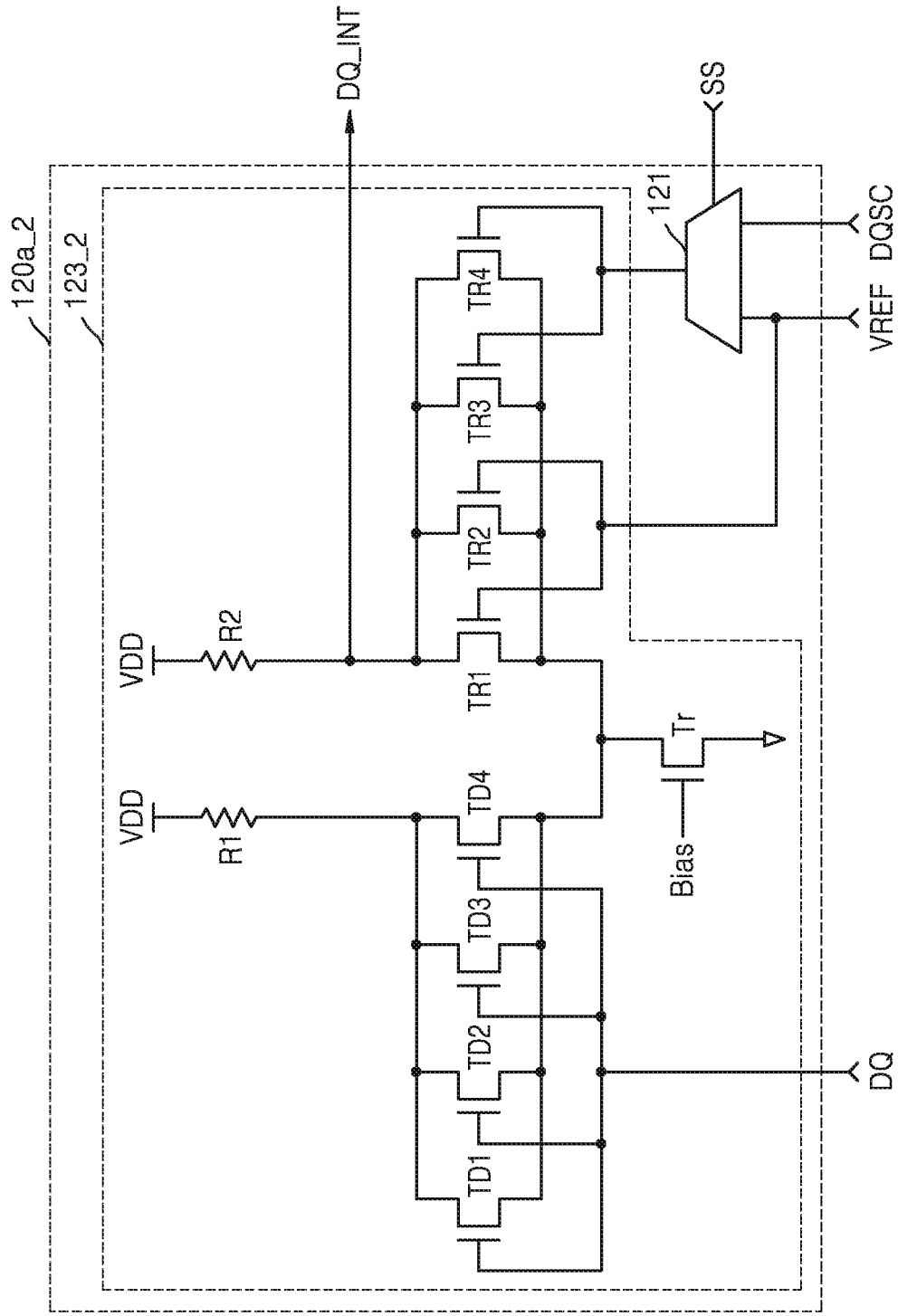
FIG. 7B is a circuit diagram of an example of a data signal receiver of FIG. 7A.

FIG. 7A is a block diagram of an example of the data signal receiver 120a of FIG. 5. FIG. 7B is a circuit diagram of an example of a data signal receiver 120a_2 of FIG. 7A. In FIGS. 6A to 7B, like reference numerals denote like elements, and for convenience of explanation, detailed descriptions of like elements will be omitted herein.

Referring to FIGS. 5 and 7A, the data signal receiver 120a_2 may include the selector 121 and an amplifier 123_2.

The selector 121 may select the common mode signal DQSC and reference voltage signal VREF and may select one of the common mode signal DQSC and reference voltage signal VREF in response to the selection signal SS.

The amplifier 123_2 may receive the external data signal DQ and the selected signal (the common mode signal DQSC or the reference voltage signal VREF) and may additionally receive the reference voltage signal VREF at, for example, the same time. The amplifier 123_2 may generate the internal data signal DQ_INT based on the external data signal DQ, the selected signal (the common mode signal DQSC or the reference voltage signal VREF), and the reference voltage signal VREF.

Therefore, when the common mode signal DQSC is selected from among the common mode signal DQSC and the reference voltage signal VREF, the data signal receiver 120a may generate the internal data signal DQ_INT based on the common mode signal DQSC, the reference voltage signal VREF, and the external data signal DQ. In contrast, when the reference voltage signal VREF is selected from among the common mode signal DQSC and the reference voltage signal VREF, the data signal receiver 120a may generate the internal data signal DQ_INT based on the reference voltage signal VREF and the external data signal DQ.

Referring to FIGS. 7A and 7B, the amplifier 123_2 may include the first transistors TD1 to TD4, the second transistors TR1 to TR4, and the transistor Tr and the first and second resistors R1 and R2. The external data signal DQ may be input to the gates of the first transistors TD1 to TD4. The reference voltage signal VREF may be input to the gates of some second transistors (e.g., the second transistors TR1 and TR2) among the second transistors TR1 to TR4, and the signal (the common mode signal DQSC or the reference voltage signal VREF) selected by the selector 121 may be input to the gates of the others (e.g., the second transistors TR3 and TR4) of the second transistors TR1 to TR4. FIG. 7B illustrates that the number of transistors having the gates, to which the reference voltage signal VREF is input, is the same as the number of transistors having the gates to which the selected signal (the common mode signal DQSC or the reference voltage signal VREF) is input. However, the data signal receiver according to example embodiments is not limited thereto, and the number of transistors of each type may vary.

Therefore, when the selector 121 selects the reference voltage signal VREF in response to the selection signal SS, signals input to the gates of the second transistors TR1 to TR4 may all be the reference voltage signal VREF. However, when the selector 121 selects the common mode signal DQSC in response to the selection signal SS, the reference voltage signal VREF may be input to the gates of some of the second transistors TR1 to TR4, and the common mode signal DQSC may be input to the gates of the others thereof.

Figure 8A:
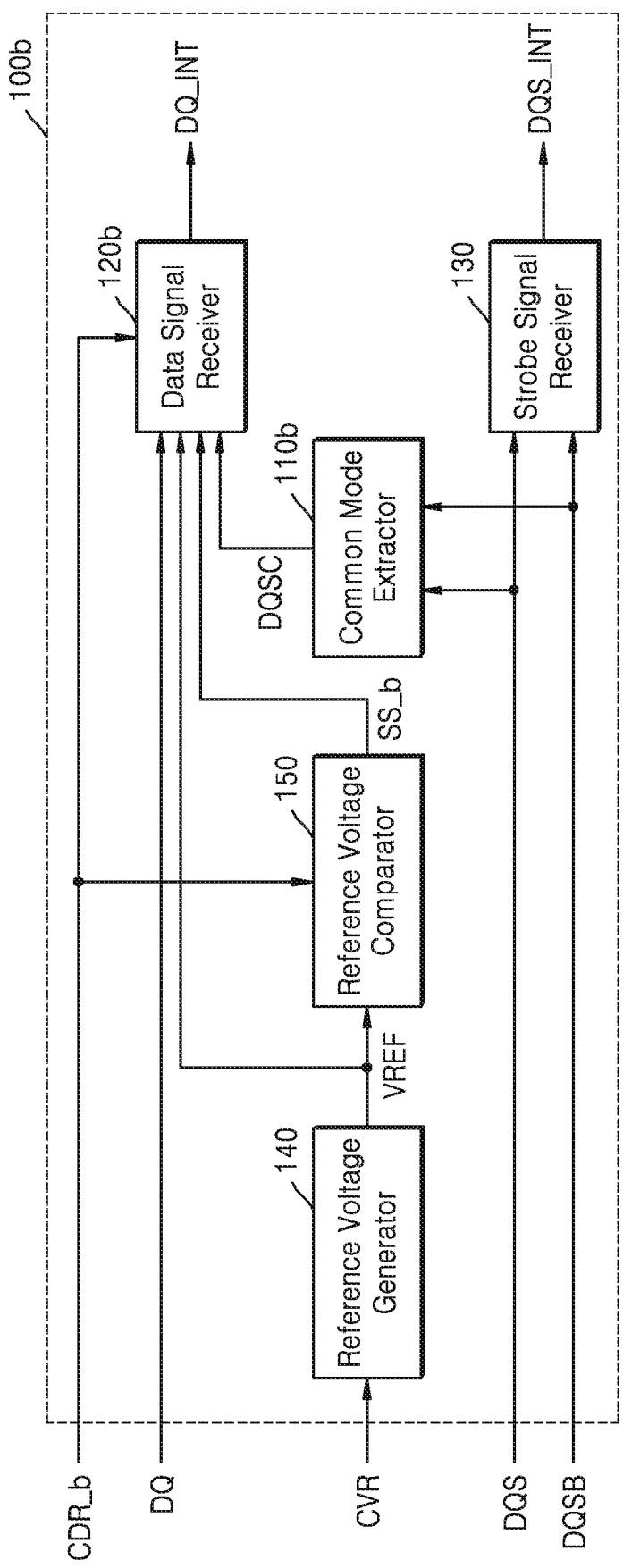
FIGS. 8A and 8B are block diagrams of an example of the memory device of FIG. 1.
Figure 8B:
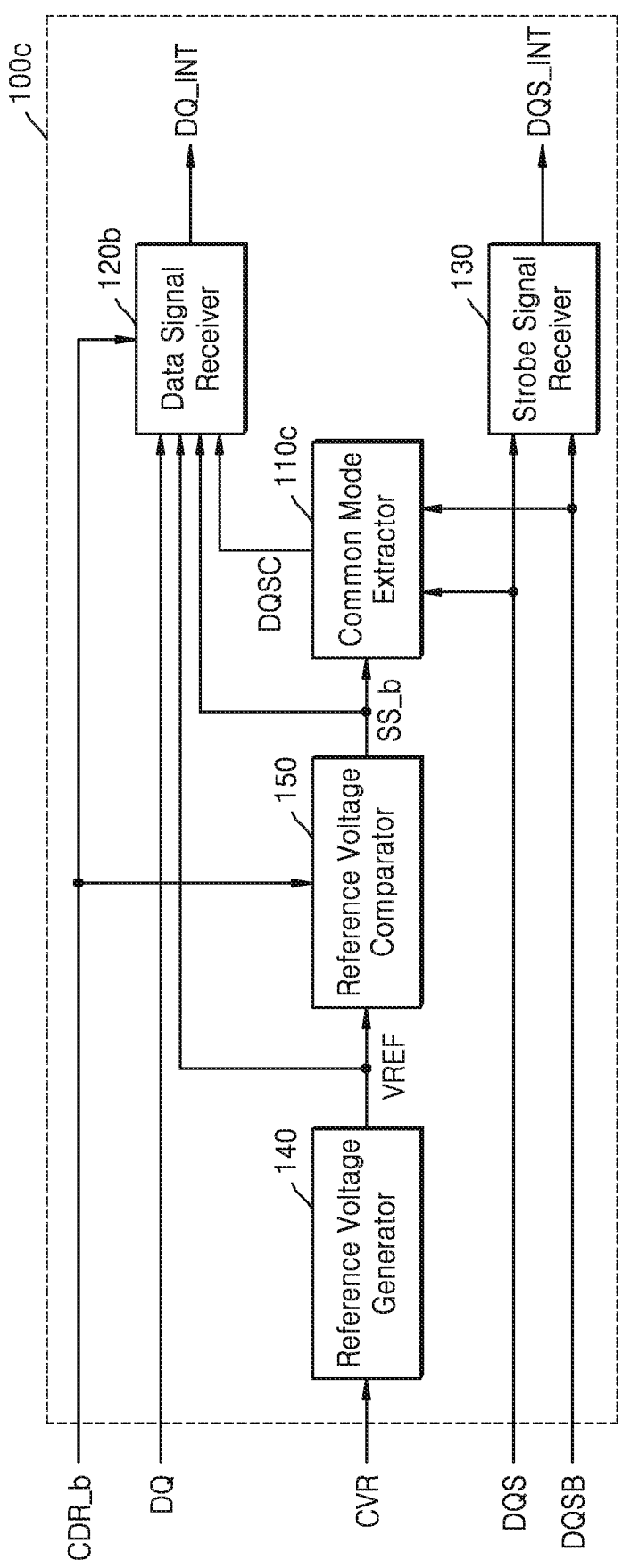

FIGS. 8A and 8B are block diagrams of an example of the memory device 100 of FIG. 1. In FIGS. 2, 5, 8A, and 8B, like reference numerals denote like elements, and for convenience of explanation, detailed descriptions of like elements will be omitted herein.

Referring to FIG. 8A, a memory device 100b may include a common mode extractor 110b, a data signal receiver 120b, the strobe signal receiver 130, the reference voltage generator 140, and a reference voltage comparator 150.

In some example embodiments, the memory device 100b may include a control circuitry (not shown) for controlling operations of the memory device 100b. The control circuitry may include the common mode extractor 110b, the data signal receiver 120b, the strobe signal receiver 130, the reference voltage generator 140, and the reference voltage comparator 150. The common mode extractor 110b, the data signal receiver 120b, the strobe signal receiver 130, the reference voltage generator 140, and the reference voltage comparator 150 may be implemented by respective circuit.

The reference voltage comparator 150 may receive the reference voltage signal VREF from the reference voltage generator 140 and may compare the reference voltage signal VREF with first and second determination voltages. Voltage levels of the first and second determination voltages may respectively be an upper limit voltage level and a lower limit voltage level of the reference voltage signal VREF that may be used by the data signal receiver 120b to generate the internal data signal DQ_INT. The reference voltage comparator 150 may generate a selection signal SS_b based on comparison results. Operations of the reference voltage comparator 150 will be described below with reference to FIGS. 10 to 11.

The reference voltage comparator 150 may receive a receiver control signal CDR_b and may perform a comparison operation in response to the receiver control signal CDR_b. In an example embodiment, the receiver control signal CDR_b may include a write command. Therefore, the reference voltage comparator 150 and the data signal receiver 120b may or may not operate together in response to the receiver control signal CDR_b. In order to prevent power from being consumed as the reference voltage comparator 150 performs unnecessary operations, the reference voltage comparator 150 may be controlled to perform the comparison operation when the data signal receiver 120b operates in response to the external data signal DQ that is input thereto.

The data signal receiver 120b may select one of the common mode signal DQSC and the reference voltage signal VREF in response to the selection signal SS_b received from the reference voltage comparator 150. The data signal receiver 120b may amplify a voltage difference between the internal data signal DQ_INT and the selected signal (the common mode signal DQSC or the reference voltage signal VREF) and may output the amplified voltage difference as the internal data signal DQ_INT. The data signal receiver 120*b* will be described below with reference to FIG. 9.

Referring to FIG. 8B, the memory device 100*c* may include a common mode extractor 110*c*.

In some example embodiments, the memory device 100*c* may include a control circuitry (not shown) for controlling operations of the memory device 100*c*. The control circuitry may include the common mode extractor 110*c*, the data signal receiver 120*b*, the strobe signal receiver 130, the reference voltage generator 140, and the reference voltage comparator 150. The common mode extractor 110*c*, the data signal receiver 120*b*, the strobe signal receiver 130, the reference voltage generator 140, and the reference voltage comparator 150 may be implemented by respective circuit.

Unlike the common mode extractor 110*b* of FIG. 8A, the common mode extractor 110*c* may receive the selection signal SS_b output from the reference voltage comparator 150. Based on the selection signal SS_b, a common mode extraction operation of the common mode extractor 110*c* may be controlled. The common mode extractor 110*c* may output the common mode signal DQSC by extracting a common mode of the differential data strobe signal DQS/DQSB based on the differential data strobe signal DQS/DQSB, in response to the selection signal SS_b. For example, when the selection signal SS_b has a first logic level (e.g., a high level), the common mode extractor 110*c* may not perform an extraction operation of extracting the common mode of the differential data strobe signal DQS/DQSB. However, when the selection signal SS_b has a second logic level (e.g., a low level), the common mode extractor 110*c* may perform the extraction operation.

Figure 9:
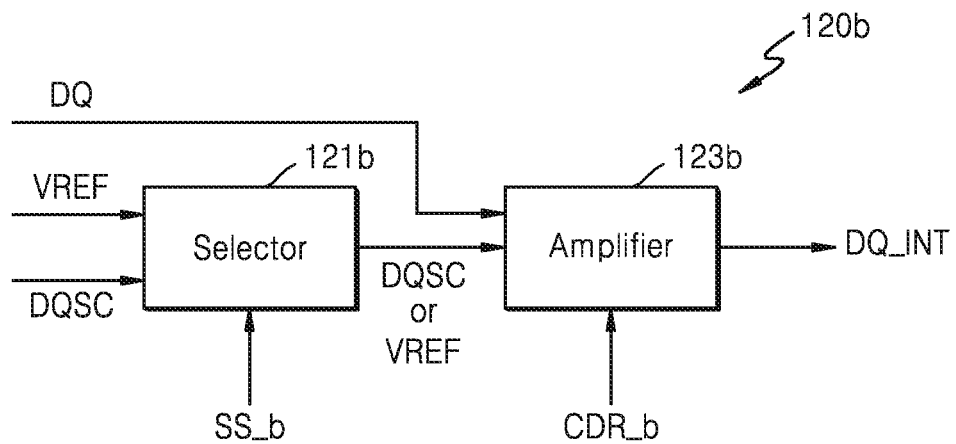
FIG. 9 is a block diagram of an example of a data signal receiver of FIGS. 8A and 8B.

FIG. 9 is a block diagram of an example of the data signal receiver 120*b* of FIGS. 8A and 8B.

Referring to FIGS. 8A to 9, the data signal receiver 120*b* may include a selector 121*b* and an amplifier 123*b*.

The selector 121*b* may select one of the common mode signal DQSC and the reference voltage signal VREF in response to the selection signal SS_b and may output the selected signal (the common mode signal DQSC or the reference voltage signal VREF). Therefore, the selector 121*b* may select one of the common mode signal DQSC and the reference voltage signal VREF based on a result of comparing the reference voltage signal VREF with the first and second determination voltages. Unlike the selection signal SS of FIG. 6A, the selection signal SS_b may be generated by the reference voltage comparator 150 within the memory device 100*b* of FIG. 8A and the memory device 100*c* of FIG. 8B.

The amplifier 123*b* may receive the external data signal DQ and the selected signal (the common mode signal DQSC or the reference voltage signal VREF) and may generate the internal data signal DQ_INT that is obtained by amplifying the external data signal DQ, in response to the receiver control signal CDR_b.

Similar to the amplifier 123_2 of FIG. 7A, the amplifier 123*b* may further receive the reference voltage signal VREF in addition to the external data signal DQ and the selected signal (the common mode signal DQSC or the reference voltage signal VREF). Therefore, when the selector 121*b* selects the common mode signal DQSC from among the common mode signal DQSC and the reference voltage signal VREF, the amplifier 123*b* may generate the internal data signal DQ_INT based on the common mode signal DQSC, the reference voltage signal VREF, and the external data signal DQ. In contrast, when the selector 121*b* selects the reference voltage signal VREF from among the common mode signal DQSC and the reference voltage signal VREF, the amplifier 123*b* may generate the internal data signal DQ_INT based on the reference voltage signal VREF and the external data signal DQ.

Figure 10:
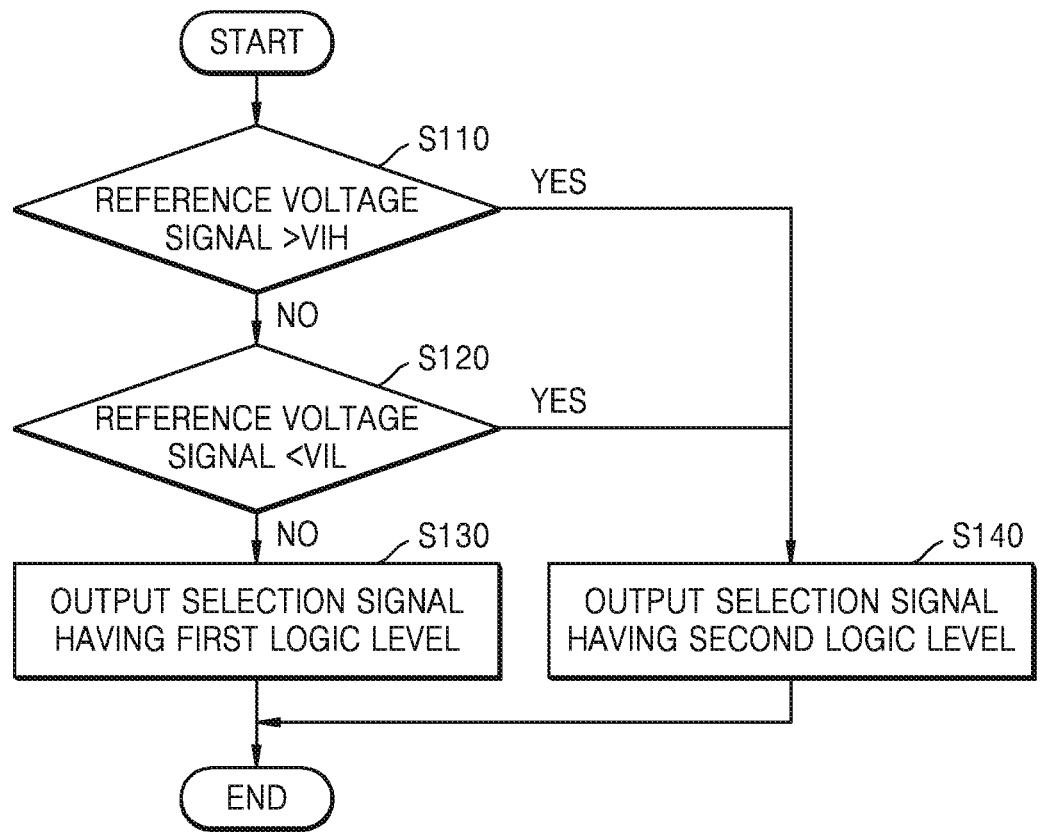
FIG. 10 is a flowchart of a comparison operation of a reference voltage comparator of FIGS. 8A and 8B.

FIG. 10 is a flowchart of a comparison operation of the reference voltage comparator 150 of FIGS. 8A and 8B.

Referring to FIGS. 8A, 8B, and 10, in operation S110, the reference voltage comparator 150 may compare a voltage level of the reference voltage signal VREF with that of a first determination voltage VIH.

When the voltage level of the reference voltage signal VREF is not higher than that of the first determination voltage VIH, in operation S120, the reference voltage comparator 150 may compare the voltage level of the reference voltage signal VREF with that of a second determination voltage VIL. The voltage level of the second determination voltage VIL may be lower than that of the first determination voltage VIH.

When the voltage level of the reference voltage signal VREF is not lower than that of the second determination voltage VIL, in operation S130, the reference voltage comparator 150 may output the selection signal SS_b having the first logic level (e.g., a logic high level), in operation S130.

When the voltage level of the reference voltage signal VREF is higher than that of the first determination voltage VIH or than that of the second determination voltage VIL, in operation S140, the reference voltage comparator 150 may output the selection signal SS_b having the second logic level.

The voltage levels of the first determination voltage VIH and the second determination voltage VIL may respectively be the upper limit voltage level and the lower limit voltage level of the reference voltage signal VREF, which may be used by the data signal receiver 120*b* to generate the internal data signal DQ_INT. Therefore, the voltage level of the first determination voltage VIH and the voltage level of the second determination voltage VIL may be determined, for example, in advance or stored, for example, in advance in the reference voltage comparator 150.

When receiving the selection signal SS_b having the first logic level, a selector (e.g., the selector 121*b* of FIG. 9) of the data signal receiver 120*b* may select the reference voltage signal VREF. For example, when the voltage level of the reference voltage signal VREF has a value between the voltage level of the first determination voltage VIH and the voltage level of the second determination voltage VIL, the selector 121*b* may select the reference voltage signal VREF. When receiving the selection signal SS_b having the second logic level, the selector 121*b* of the data signal receiver 120*b* may select the common mode signal DQSC.

Figure 11:
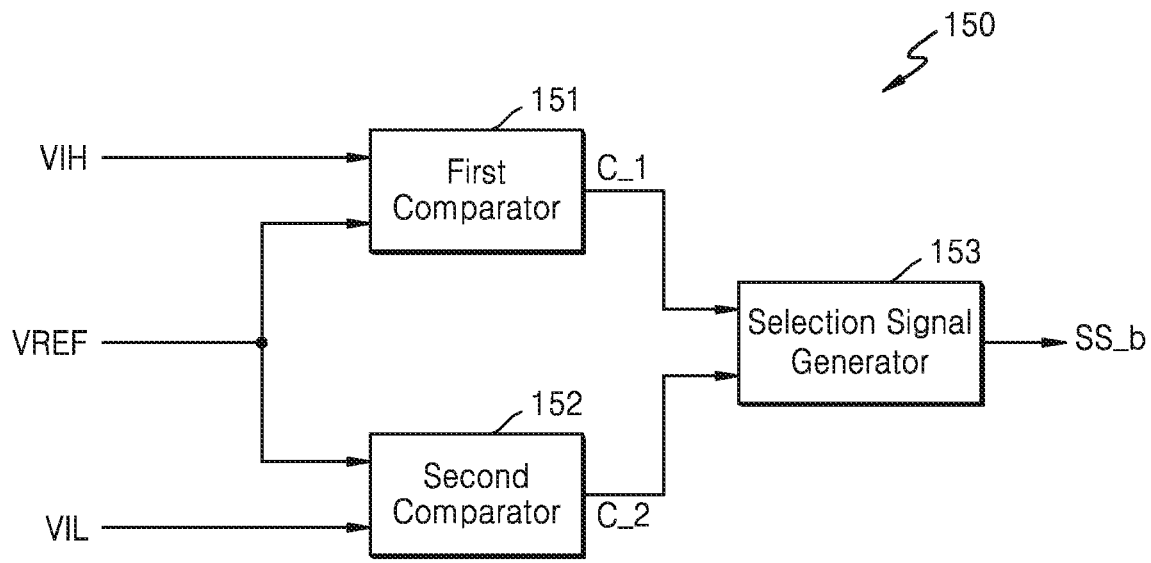
FIG. 11 is a block diagram of an example of a reference voltage comparator of FIGS. 8A and 8B.

FIG. 11 is a block diagram of an example of the reference voltage comparator 150 of FIGS. 8A and 8B.

Referring to FIG. 11, the reference voltage comparator 150 may include a first comparator 151, a second comparator 152, and a selection signal generator 153.

The first comparator 151 may compare the voltage level of the first determination voltage VIH with the voltage level of the reference voltage signal VREF and thus may generate a first control signal C_1. For example, when the voltage level of the reference voltage signal VREF is higher than that of the first determination voltage VIH, the first comparator 151 may generate the first control signal C_1 having a first logic level (e.g., a logic high level), and when the voltage level of the reference voltage signal VREF is lower than that of the first determination voltage VIH, the first comparator 151 may generate the first control signal C_1 having a second logic level (e.g., a logic low level).

The second comparator 152 may compare the voltage level of the second determination voltage VIL with that of the reference voltage signal VREF and thus may generate a second control signal C_2. For example, when the voltage level of the reference voltage signal VREF is higher than that of the second determination voltage VIL, the second comparator 152 may generate the second control signal C_2 having a second logic level, and when the voltage level of the reference voltage signal VREF is lower than that of the second determination voltage VIL, the second comparator 152 may generate the second control signal C_2 having a first logic level. However, this description is merely an example, and according to circuit configurations of the first comparator 151 and the second comparator 152, the first comparator 151 and the second comparator 152 perform the comparison operations, and according to comparison results, the first control signal C_1 and the second control signal C_2 may be output differently from the above description.

The selection signal generator 153 may generate the selection signal SS_b based on the first control signal C_1 and the second control signal C_2. For example, when both the first control signal C_1 and the second control signal C_2 have the second logic level, that is, when the voltage level of the reference voltage signal VREF is lower than that of the first determination voltage VIH, but higher than that of the second determination voltage VIL, the selection signal generator 153 may generate the selection signal SS_b having the first logic level. In contrast, when the first control signal C_1 or the second control signal C_2 has the first logic level, the selection signal generator 153 may generate the selection signal SS_b having the second logic level.

Figure 12:
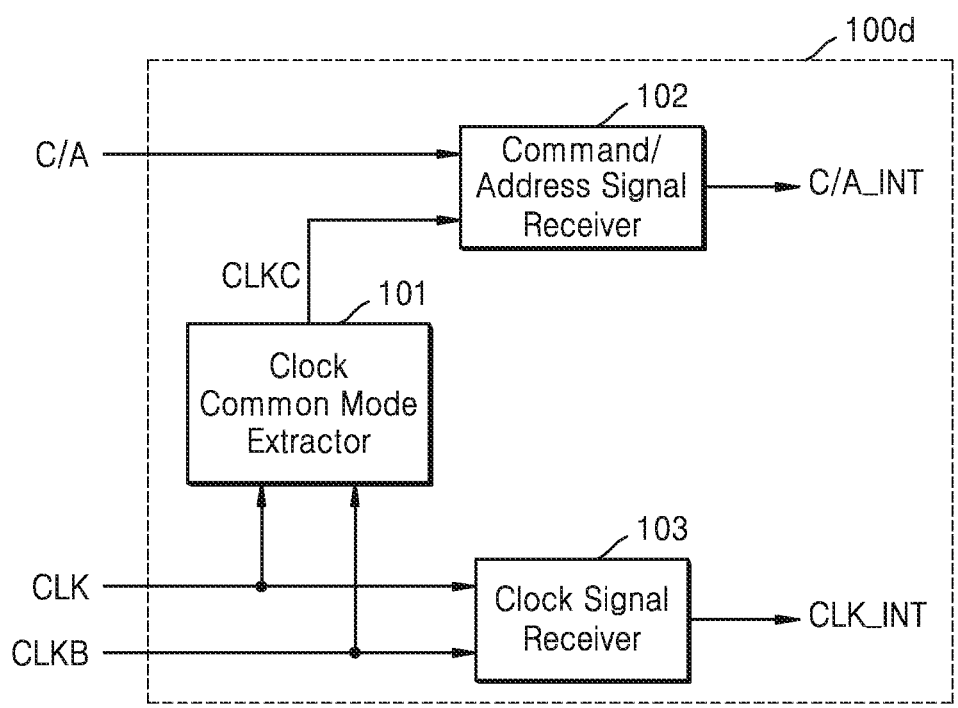
FIG. 12 is a block diagram of an example of the memory device of FIG. 1.

FIG. 12 is a block diagram of an example of the memory device 100 of FIG. 1.

Referring to FIG. 12, a memory device 100d may include a clock common mode extractor 101, a command/address signal receiver 102, and a clock signal receiver 103.

In some example embodiments, the memory device 100d may include a control circuitry (not shown) for controlling operations of the memory device 100d. The control circuitry may include the clock common mode extractor 101, the command/address signal receiver 102, and the clock signal receiver 103. The clock common mode extractor 101, the command/address signal receiver 102, and the clock signal receiver 103 may be implemented by respective circuit.

The clock common mode extractor 101 may receive the differential clock signal CLK/CLKB and may extract a common mode of the differential clock signal CLK/CLKB based on the differential clock signal CLK/CLKB, thereby outputting a clock common mode signal CLKC. Therefore, the clock common mode signal CLKC, which has a value between a high voltage level and a low voltage level of a single clock signal CLK, may be output. The clock common mode extractor 101 may have a similar circuit to the common mode extractor 110 of FIG. 3.

The command/address receiver 102 may receive an external command/address signal C/A and the clock common mode signal CLKC and may compare the external command/address signal C/A with the clock common mode signal CLKC, thereby generating an internal command/address signal C/A_INT. In an example embodiment, the command/address receiver 102 may include an amplifier and thus may amplify a voltage difference between the external command/address signal C/A and the clock common mode signal CLKC, thereby outputting the amplified voltage difference as the internal command/address signal C/A_INT.

The clock signal receiver 103 may receive the differential clock signal CLK/CLKB and may generate an internal clock signal CLK_INT for latching the internal command/address signal C/A_INT. In an example embodiment, the clock signal receiver 103 may be an amplifier and may amplify a voltage difference between the differential clock signals CLK/CLKB, thereby outputting the amplified voltage difference as the internal clock signal CLK_INT.

The memory device 100d may further include a latch circuit (not shown). The latch circuit may receive the internal command/address signal C/A_INT and the internal clock signal CLK_INT and may latch the internal command/address signal C/A_INT based on the internal clock signal CLK_INT.

When an internal reference voltage is generated in a memory device, the internal reference voltage may be affected by noise due to characteristics of the memory device itself. Further, when the external command/address signal C/A is transmitted to a memory device from the outside, the external command/address signal C/A may be affected by noise due to reasons other than the characteristics of the memory device. Therefore, when a command/address receiver amplifies the external command/address signal C/A based on the internal reference voltage, the internal command/address signal C/A_INT may be generated while noise in the internal reference voltage has not yet been removed. Further, in order to secure accuracy of the internal command/address signal C/A_INT, a memory controller may take a certain amount of time to set and adjust the level of the internal reference voltage.

On the contrary, in one or more example embodiments, the memory device 100d may use a common mode voltage of the differential clock signal CLK/CLKB, instead of using a reference voltage generated within the memory device 100d, and may generate the internal command/address signal C/A_INT.

Since the differential clock signal CLK/CLKB and the external command/address signal C/A are received by the memory device 100d from the memory controller 200, the differential clock signal CLK/CLKB and the external command/address signal C/A may be commonly affected by noise generated outside the memory device 100d by, for example, the memory controller 200. Since the command/address receiver 102 uses the common mode voltage of the differential clock signal CLK/CLKB, the memory device 100d may remove common noise of the clock common mode signal CLKC and the external command/address signal C/A. Also, a time taken by the memory controller 200 to set and adjust the level of the reference voltage may be saved.

Figure 13:
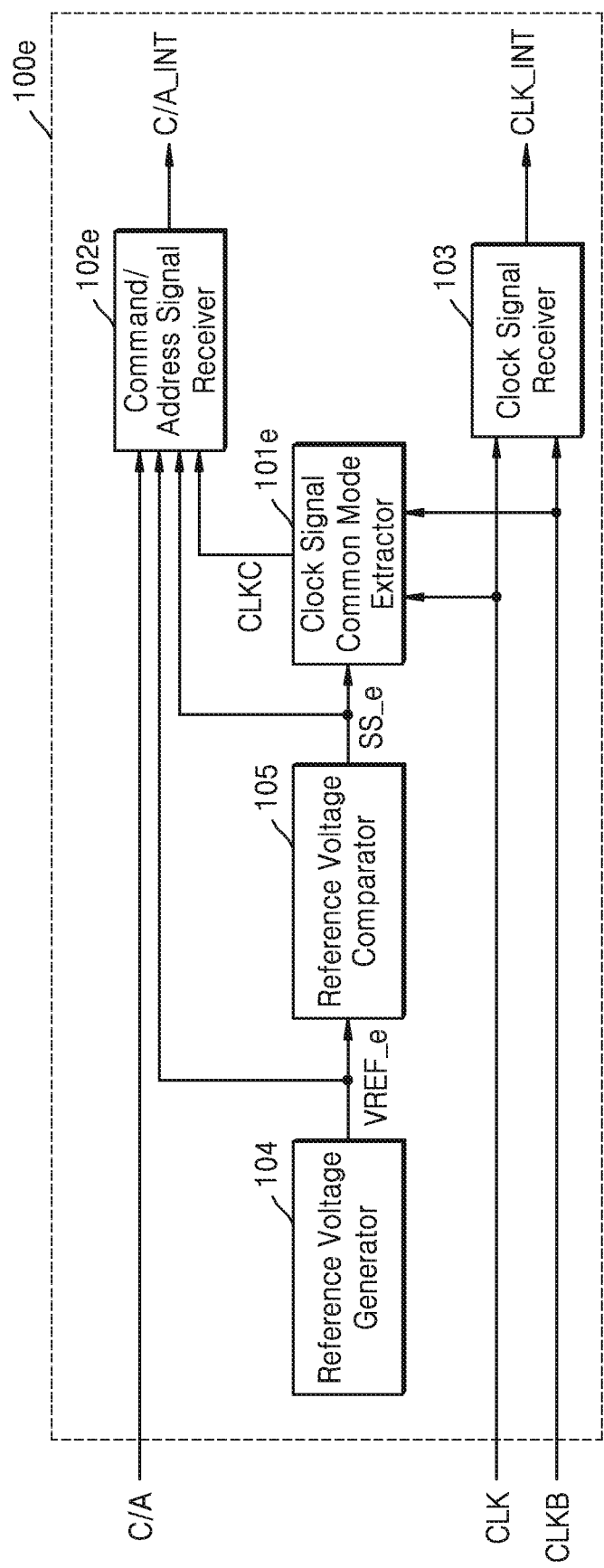
FIG. 13 is a block diagram of an example of the memory device of FIG. 1.

FIG. 13 is a block diagram of an example of the memory device 100 of FIG. 1. In FIGS. 12 and 13, like reference numerals denote like elements, and for convenience of explanation, detailed descriptions of like elements will be omitted herein.

Referring to FIG. 13, a memory device 100e may include a clock common mode extractor 101e, a command/address receiver 102e, the clock signal receiver 103, a reference voltage generator 104, and a reference voltage comparator 105.

In some example embodiments, the memory device 100e may include a control circuitry (not shown) for controlling operations of the memory device 100e. The control circuitry may include the clock common mode extractor 101e, the command/address receiver 102e, the clock signal receiver 103, the reference voltage generator 104, and the reference voltage comparator 105. The clock common mode extractor 101e, the command/address receiver 102e, the clock signal receiver 103, the reference voltage generator 104, and the reference voltage comparator 105 may be implemented by respective circuit.

The reference voltage generator 104 may generate a reference voltage signal VREF_e having a voltage level between a high voltage level and a low voltage level of the external command/address signal C/A. In an example embodiment, the voltage level of the reference voltage signal VREF_e may have an average of the high voltage level and the low voltage level of the external command/address signal C/A. Based on a control signal received from the memory controller (200 of FIG. 1), the reference voltage generator 104 may generate the reference voltage signal VREF_e having the voltage level that corresponds to the control signal.

The reference voltage comparator 105 may receive the reference voltage signal VREF_e from the reference voltage generator 104 and may compare the reference voltage signal VREF_e with the first and second determination voltages. The voltage levels of the first and second determination voltages may respectively be an upper limit voltage level and a lower limit voltage level of the reference voltage signal VREF_e which may be used by the command/address receiver 102e to generate an internal command/address signal C/A_INT. The voltage levels of the first and second determination voltages may be determined in advance or may be stored in advance in the reference voltage comparator 105.

Based on comparison results obtained by performing the comparison operations, the reference voltage comparator 105 may generate a selection signal SS_e. In an example embodiment, when the voltage level of the reference voltage signal VREF_e has a value between the voltage level of the first determination voltage and that of the second determination voltage, the reference voltage comparator 105 may output the selection signal SS_e having a first voltage level (e.g., a high level), but when the voltage level of the reference voltage signal VREF_e does not have the value between the voltage level of the first determination voltage and that of the second determination voltage, the reference voltage comparator 105 may output the selection signal SS_e having a second voltage level (e.g., a low level). Descriptions regarding the structure and the comparison operation of the reference voltage comparator 150 of FIGS. 10 and 11 may be applied to the descriptions regarding structure and the comparison operation of the reference voltage comparator 105.

The clock common mode extractor 101e may receive the selection signal SS_e output from the reference voltage comparator 105. Based on the selection signal SS_e, a common mode extraction operation of the clock common mode extractor 101e may be controlled. That is, the clock common mode extractor 101e may generate the clock common mode signal CLKC in response to a result of the comparison operation of the reference voltage comparator 105. For example, when the selection signal SS_e has the first logic level (e.g., a high level), the clock common mode extractor 101e may not perform an extraction operation of extracting a common mode of the differential clock signal CLK/CLKB. However, when the selection signal SS_e has the second logic level (e.g., a low level), the clock common mode extractor 101e may perform the extraction operation. However, the memory device 100e according to an example embodiment is not limited thereto. The clock common mode extractor 101e may not receive the selection signal SS_e and thus may output the clock common mode signal CLKC regardless of the selection signal SS_e.

The command/address receiver 102e may select one of the clock common mode signal CLKC and the reference voltage signal VREF_e in response to the selection signal SS_e received from the reference voltage comparator 105. The command/address receiver 102e may amplify a voltage difference between the internal command/address signal C/A_INT and the selected signal (the clock common mode signal CLKC or the reference voltage signal VREF_e) and may output the amplified voltage difference as the internal command/address signal C/A_INT. In this case, similar to the data signal receiver 120b of FIG. 9, the command/address receiver 102e may include a selector and an amplifier.

However, the memory device 100e according to an example embodiment is not limited thereto. The command/address receiver 102e may generate the internal command/address signal C/A_INT based on the reference voltage signal VREF_e, in addition to the internal command/address signal C/A_INT and the selected signal (the clock common mode signal CLKC or the reference voltage signal VREF_e). Therefore, the command/address receiver 102e may include a similar circuit configuration to the data signal receivers 120a_1 and 120a_2 of FIGS. 6B and 7B.

The memory device 100e according to an example embodiment may not include the reference voltage comparator 105, and the command/address receiver 102e may select one of the clock common mode signal CLKC and the reference voltage signal VREF_e based on a control signal received from a memory controller (e.g., the memory controller 200 of FIG. 1).

Figure 14:
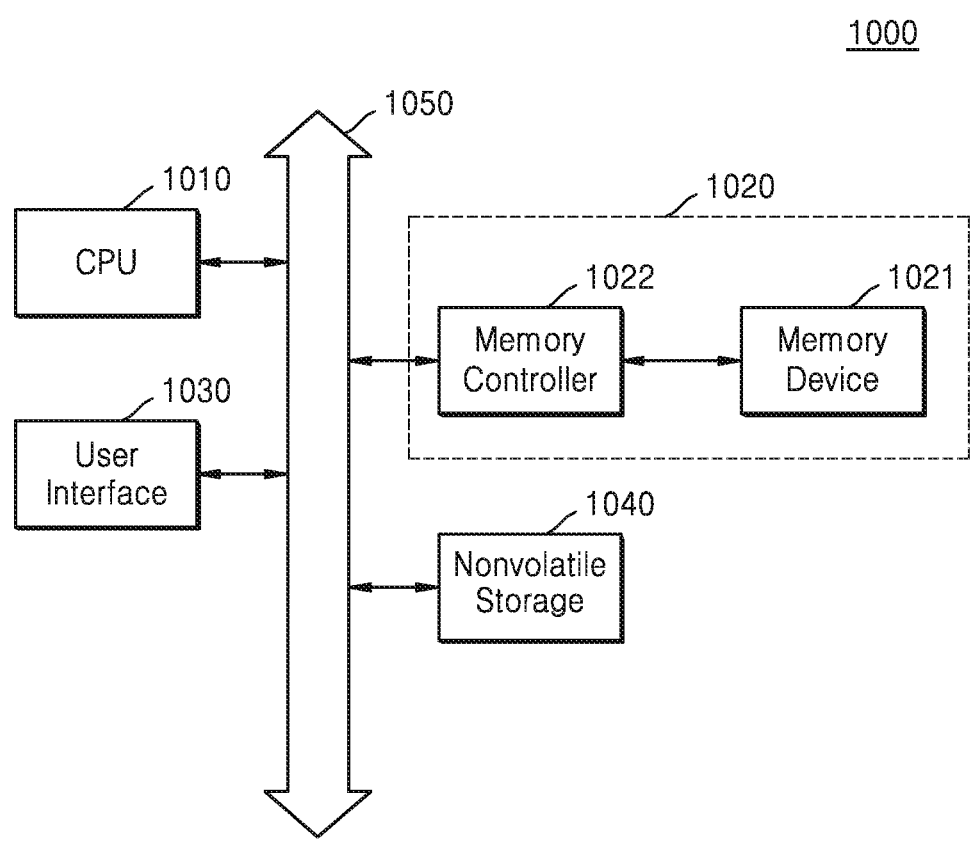
FIG. 14 is a block diagram of a computing system according to an example embodiment.

FIG. 14 is a block diagram of a computing system 1000 according to an example embodiment.

Referring to FIG. 14, the computing system 1000 may include a central processing unit (CPU) 1010, a memory system 1020, a user interface 1030, and a non-volatile storage 1040. The CPU 1010, the memory system 1020, the user interface 1030, and the non-volatile storage 1040 may communicate with one another via a bus 1050. Although not illustrated in FIG. 14, the computing system 1000 may further include ports capable of communicating with a video card, a sound card, a memory card, a Universal Serial Bus (USB) device, etc. or with other electronic devices. The computing system 1000 may be embodied as a Personal Computer (PC) or a server and may be embodied as a portable electronic device such as a laptop computer, a mobile phone, a personal digital assistant (PDA), or a camera.

The CPU 1010 may perform certain calculations or tasks. According to an example embodiment, the CPU 1010 may be a micro-processor or a graphics processing unit (GPU). The CPU 1010 may communicate with the memory system 1020, the user interface 1030, and the non-volatile storage 1040 via the bus 1050. The CPU 1010 may be connected to an expansion bus such as a Peripheral Component Interconnect (PCI) bus.

The memory system 1020 may include a memory device 1021 and a memory controller 1022 and may store therein data necessary for operations of the computing system 1000. For example, the memory system 1020 may function as a data memory of the CPU 1010 or may support Direct Memory Access (DMA), thereby storing data received from the bus 1050 or transmitting stored data thereto. The memory device 1021 according to an example embodiment may include the memory devices 100, 100a, 100b, 100c, 100d, and 100e described with reference to FIGS. 1 to 13.

Therefore, the memory device 1021 may receive, from the memory controller 1022, a differential clock signal, a command/address signal, a differential data strobe signal, an external data signal, and control signals for controlling the memory device 1021. The memory device 1021 may use a common mode of the differential data strobe signal to amplify an external data signal into an internal data signal and may use a differential clock signal to amplify an external command/address signal into an internal command/address signal.

The user interface 1030 may include an input medium, e.g., a keyboard, a keypad, a mouse, or the like, to receive an input signal from a user and may include an output medium, e.g., a printer, a display device, or the like, to provide the user with an output signal.

The non-volatile storage 1040 may include, e.g., a non-volatile semiconductor memory device such as EEPROM, flash memory, PRAM, RRAM, NFGM, PoRAM, MRAM, or FRAM or may include a magnetic disk, etc.

According to one or more example embodiments, the units and/or devices described above, such as the components of the memory devices 100, 100a, 100b, 100c, 100d, and 100e including the various reference voltage generators, reference voltage comparators, data (command/address) signal receivers, common (clock) mode extractors and strobe (clock) signal receivers, may be implemented using hardware, a combination of hardware and software, or a non-transitory storage medium storing software that is executable to perform the functions of the same.

Hardware may be implemented using a control circuitry, and the control circuitry may include the various reference voltage generators, reference voltage comparators, data (command/address) signal receivers, common (clock) mode extractors and strobe (clock) signal receivers.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a control circuitry, the control circuitry may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

A hardware device, such as a control circuitry, may run an operating system (OS) and one or more software applications that run on the OS. The computer processing device also may access, store, manipulate, process, and create data in response to execution of the software. Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

While example embodiments the inventive concepts have been particularly shown and described with reference to some example embodiments thereof, it will be understood that various changes in form and details may be made therein without departing from the spirit and scope of the following claims.

What is claimed is:

1. A memory device configured to receive a differential data strobe signal and an external data signal from outside the memory device, the memory device comprising:
control circuitry configured to,
extract a common mode of the differential data strobe signal to generate a common mode signal such that a voltage level of the common mode signal is between a logic-high voltage level and a logic-low voltage level of the external data signal, compare a voltage level of the external data signal and the voltage level of the common mode signal, generate an internal data signal based on a result of comparing the voltage level of the external data signal and the voltage level of the common mode signal, and generate an internal data strobe signal based on the differential data strobe signal, the internal data strobe signal associated with latching the internal data signal.

2. The memory device of claim 1, wherein
the logic-high voltage level of the external data signal is a same as a logic-high voltage level of the differential data strobe signal, and the logic-low voltage level of the external data signal is the same as a logic-high voltage level of the differential data strobe signal.

3. The memory device of claim 1, wherein the control circuitry is further configured to generate a reference voltage signal such that the reference voltage signal has a voltage level between a logic-high voltage level and a logic-low voltage level of the external data signal.

4. The memory device of claim 3, wherein the control circuitry is further configured to,
select one of the reference voltage signal and the common mode signal to generate a selected one of the reference voltage signal and the common mode signal; and generate the internal data signal based on the selected one of the reference voltage signal and the common mode signal.

5. The memory device of claim 4, wherein the control circuitry is further configured to generate the internal data signal based on the reference voltage signal and the selected one of the reference voltage signal and the common mode signal.

6. The memory device of claim 4, wherein the control circuitry is further configured to,
compare a voltage level of the reference voltage signal with a voltage level of a first determination voltage to generate a first comparison result, and compare the voltage level of the reference voltage signal with a voltage level of a second determination voltage to generate a second comparison result.

7. The memory device of claim 6, wherein the control circuitry is further configured to,
select one of the reference voltage signal and the common mode signal based on the first comparison result and the second comparison result.

8. The memory device of claim 6, wherein the control circuitry is configured to generate the common mode signal in response to one or more of the first comparison result and the second comparison result.

9. A memory device configured to receive a differential clock signal and an external command/address signal from outside the memory device, the memory device comprising:
control circuitry configured to,
extract a common mode of the differential clock signal to generate a clock common mode signal such that a voltage level of the clock common mode signal is between a logic-high voltage level and a logic-low voltage level of the external command/address signal, compare a voltage level of the external command/address signal and the voltage level of the clock common mode signal, generate an internal command/address signal based on a result of comparing the voltage level of the external command/address signal and the voltage level of the clock common mode signal, and generate an internal clock signal based on the differential clock signal, the internal clock signal being associated with latching the internal command/address signal.

10. The memory device of claim 9, wherein
the logic-high voltage level of the external command/address signal is a same as a logic-high voltage level of the differential clock signal, and the logic-low voltage level of the external command/address signal is the same as a logic-low voltage level of the differential clock signal.

11. The memory device of claim 9, wherein the control circuitry is further configured to,
generate a reference voltage signal having a voltage level between a logic-high voltage level and a logic-low voltage level of the external command/address signal, and generate the internal command/address signal based on one of the reference voltage signal and the clock common mode signal.

12. The memory device of claim 11, wherein the control circuitry is further configured to,
compare a voltage level of the reference voltage signal with a voltage level of a first determination voltage to generate a first comparison result, and compare the voltage level of the reference voltage signal with a voltage level of a second determination voltage to generate a second comparison result.

13. The memory device of claim 12, wherein the control circuitry is configured to generate the clock common mode signal based on one or more of the first comparison result and the second comparison result.

14. A memory device configured to receive a differential data strobe signal and an external data signal from a memory controller, the memory device comprising:
control circuitry configured to,
extract a common mode of the differential data strobe signal to generate a common mode signal such that a voltage level of the common mode signal is same as an average of a logic-high voltage level and a logic-low voltage level of the external data signal, and generate an internal data signal based on the external data signal and the common mode signal.

15. The memory device of claim 14, wherein the control circuitry is further configured to generate a reference voltage signal such that the reference voltage signal has a voltage level between the logic-high voltage level and the logic-low voltage level of the external data signal.

16. The memory device of claim 15, wherein the control circuitry is further configured to,
select, in response to a selection signal, one of the reference voltage signal and the common mode signal to generate a selected one of the reference voltage signal and the common mode signal, and generate the internal data signal based on the selected one of the reference voltage signal and the common mode signal.

17. The memory device of claim 16, wherein the control circuitry is configured to receive the selection signal from the memory controller.

18. The memory device of claim 16, wherein the control circuitry is further configured to, compare a voltage level of the reference voltage signal with the voltage level of a first determination voltage to generate a first comparison result, compare the voltage level of the reference voltage signal with a voltage level of a second determination voltage to generate a second comparison result, and generate the selection signal based on one or more of the first comparison result and the second comparison result.

19. The memory device of claim 18, wherein the control circuitry is configured to generate the internal data signal and the selection signal based on a same control signal from the memory controller.

20. The memory device of claim 18, wherein the control circuitry is configured to generate the common mode signal based on the selection signal.

* * * * *